US007271612B2

(12) United States Patent
Miyamoto et al.

(10) Patent No.: US 7,271,612 B2
(45) Date of Patent: Sep. 18, 2007

(54) METHOD FOR MEASURING THIN FILM TRANSISTOR ARRAY OF ACTIVE MATRIX DISPLAY PANEL

(75) Inventors: Takashi Miyamoto, Hachioji (JP); Kayoko Tajima, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/264,282

(22) Filed: Nov. 1, 2005

(65) Prior Publication Data

US 2006/0109024 A1 May 25, 2006

(30) Foreign Application Priority Data

Nov. 22, 2004 (JP) ............................ 2004-337344

(51) Int. Cl.
*G01R 31/00* (2006.01)

(52) U.S. Cl. ...................................................... 324/770

(58) Field of Classification Search ................. 324/770
See application file for complete search history.

(56) References Cited

U.S. PATENT DOCUMENTS 5,506,599 A * 4/1996 Iwama ........................ 345/94
5,994,916 A * 11/1999 Hayashi ...................... 324/770
7,012,445 B2 * 3/2006 Itagaki ....................... 324/770
2004/0135596 A1 * 7/2004 Miyagawa et al. ......... 324/770

* cited by examiner

*Primary Examiner*—Ha Tran Nguyen
*Assistant Examiner*—Roberto Velez

(57) ABSTRACT

A method for measuring the holding properties of a TFT array of an active matrix display panel comprising multiple pixel circuits with holding capacitors, this measuring method being characterized in that the multiple pixel circuits comprise at least a first pixel circuit and a second pixel circuit, and the method comprises a step for charging to the holding capacitor of the first pixel circuit, a step for then charging to the holding capacitor of the second pixel circuit, a step for performing an effect-eliminating procedure due to floating capacity, and a step for measuring the charge of the holding capacitor of the first and second pixel circuits wherein a predetermined holding time after charging has elapsed.

5 Claims, 11 Drawing Sheets

*Amount of movement within a pixel group (0, +1)*

*Amount fo movement between pixel groups (+S, O)*

METHOD FOR MEASURING THIN FILM TRANSISTOR ARRAY OF ACTIVE MATRIX DISPLAY PANEL

FIELD OF THE INVENTION

The present invention relates to a method for measuring the holding properties of a TFT (thin-film transistor) array of an active matrix display panel.

DISCUSSION OF THE BACKGROUND ART

By means of tests of active matrix display panels that operate by liquid crystals or electroluminescence (EL hereafter; for instance, an organic EL or other EL element), circuit tests referred to as array tests are conducted on each pixel of a TFT array wherein each pixel circuit is made in matrix form on a panel.

The present Specification includes both TFT arrays that are subjected to array tests before the liquid crystals or EL elements have been formed or those that are subjected to array tests after the liquid crystals or EL elements have been formed. It is generally preferred that defective products be rejected before the expensive pixels are formed in order to reduce production costs.

Each pixel circuit of the TFT array of a display panel generally comprises a pixel selecting transistor for selecting pixels; a holding capacitor for accumulating voltage supplied to the pixels; and a pixel driving part for driving the pixels in accordance with the supplied voltage.

One array test involves examining the holding properties of the holding capacitor. By means of this test, a predetermined charge is written in the holding capacitor and the charge that remains after a predetermined holding time (generally 16.7 ms of frame time) has elapsed is read. FIGS. 13 and 14 and paragraphs 49 through 55 of Japan Patent Publication 7[1995]-5408, relate to active matrix liquid crystals and show an algorithm for shortening the measurement time of holding capacitor tests on liquid crystal TFT arrays.

On the other hand, the liquid crystals of active matrices of recent years have a shift register that corresponds to both the horizontal and vertical shift registers of a TFT array as referred in Sony, LCX028BMT (4.6 cm (1.8-inch) black-and-white LCD panel) data sheet.

The following is a discussion of the method for measuring the holding capacitor which has been developed by the inventors for a TFT array of an active matrix display panel comprising control lines to a shift register for pixel selection based on the testing method disclosed in FIG. 13 of Japan Patent Publication 7[1995]-5408, FIGS. 13 and 14, paragraphs 49 through 55.

It should be noted that as in Japan Patent Publication 7[1995]-5408, FIGS. 13 and 14, paragraphs 49 through 55, writing time Tw and reading time Tr of the holding capacitor are the same and are represented by $\tau$ in this discussion.

As shown in the block diagram in FIG. 10 of a general testing device 1300 assumed by the inventors, a TFT array 1302 comprises an H shift register (horizontal shift register) 1340 for selecting data lines and a V shift register (vertical shift register) 1342 for selecting gate lines, and the pixels (represented by 1356, 1358, and 1360) are selected and tested by these registers. There is a clock terminal (CLK_H 1328, CLK_V 1348) and a pulse input terminal (Start_H 1330, Start_V 1346) at each shift register and these terminals perform the shift operation. An enable terminal (ENB_V) is connected to the V shift register. A charge meter Q 1310 for performing a measurement of electric charges and a variable voltage source 1322 are connected in series to a power source terminal 1324 of the H shift register.

However, as persons skilled in the art can easily understand, $T_w$ and $T_r$ must be the same, because the holding time $T_h$ to each pixel in a group that will be written in a lot and be read in a lot must be the same according to the method shown in FIG. 13 of the Japan Patent Publication 7[1995]-5408.

Next, the measuring method by the testing device in FIG. 10 that was assumed by the inventors will be described using the timing chart in FIG. 11. This testing method is the procedure whereby all of the pixels are divided into multiple pixel groups and tests are performed by each pixel group. This discussion focuses on the $j^{th}$ pixel group. After writing, that is, charging to the holding capacitor, first pixel $P_{j,1}$ for writing time W (that is, $T_w$ in FIG. 13 of Japan Patent Publication 7[1995]-5408) starting from time $t_{10}$, the charge is read, that is, measured, over reading time R starting from time $t_{13}$ after holding time H (that is, $T_h$ in FIG. 13 of Japan Patent Publication 7[1995]-5408). $A_1$ here is the waiting time during writing for the difference between writing time W and reading time R in order to guarantee holding time H of each pixel.

The number of pixels of each pixel group in the method shown in FIG. 11 becomes a maximum of N=H/R from the relationship between holding time H and reading time R. The total number of pixel groups are assumed M.

Hereafter the $i^{th}$ pixel of the $j^{th}$ pixel group will be represented as $P_{i,j}$ in the present specification. The term "pixel group" means pixels measured together as one group.

It should be noted that $A_3$ in FIG. 11 is the waiting time, which becomes a fraction due to the relationship between holding time H and reading time R.

When this is applied to FIG. 10, the step is implemented whereby data line $D_m$ is set at writing voltage $V_w$ and writing is performed from the top to the bottom on N number of pixels 1356, 1358, 1360 . . . , while data line $D_m$ is set at reading voltage $V_r$ and reading is performed from the top to the bottom of pixels 1356, 1358, 1360 . . . , wherein holding time H has elapsed, and the holding measurements are studied.

There is a concern that various floating capacities will be present because the circuits are housed in a TFT array. In particular, there is a concern that the charge that has accumulated in these floating capacities between the data lines and other various signal lines once N number of pixels have been written will have an effect in the form of a difference in measurements when the first pixel of the next reading operation is measured.

SUMMARY OF THE INVENTION

Therefore, an object of the present invention is to provide a method for testing the holding properties of the holding capacitor of a TFT array for reducing the effect of an accumulation of charge in floating capacity during reading on the measured values during reading.

Another object of the present invention is to provide a testing method for reducing the effect on measurements during reading by performing an effect-eliminating procedure for eliminating the effect of the charge that has accumulated in floating capacity during writing before reading and measurement are performed. A testing method for high-precision measurement during reading is therefore provided without greatly changing the holding property tests of the holding capacitor on conventional TFT arrays.

Still another object of the present invention is to provide a testing method for high-precision measuring during reading without greatly changing the holding property tests of the holding capacitor of conventional TFT arrays.

The above-mentioned objects of the present invention are accomplished by the combination of characteristics cited in the independent claims of the invention. The dependent claims specify preferred embodiments of the present invention.

By means of the first embodiment of the method for measuring the holding properties of a TFT array of an active matrix comprising multiple pixel circuits with holding capacitors of the present invention, each of the multiple pixel circuits comprises a holding capacitor, a switching transistor for connecting a data line to the holding capacitor, and a gate line for controlling the switching of the switching transistor; the multiple pixel circuits comprise at least a first pixel circuit and a second pixel circuit; and this measuring method comprises a step for charging to the holding capacitor of the first pixel circuit and then charging to the holding capacitor of the second pixel circuit, performing an effect-eliminating procedure, and measuring the charge of the holding capacitors of the first and second pixel circuits wherein a predetermined holding time after charging has elapsed.

The measuring method of the present invention also includes the embodiment wherein the multiple pixel circuits comprise a third pixel circuit and the effect-eliminating procedure comprises a step for selecting the data line and gate line of the third pixel circuit; the embodiment whereby the effect-eliminating procedure comprises a step for measuring the charge of the holding capacitor of the third pixel circuit, and the embodiment wherein, by means of the effect-eliminating procedure, the shift register to which the gate line connected to multiple pixel circuits is connected is operated such that certain gate lines are not selected even though logic ON is applied to the enable terminal.

The measurement method of the present invention further includes the embodiment wherein the first and second pixels are connected to the first data line; the embodiment wherein the third pixel is also connected to the first data line; and the embodiment characterized in that the second and third pixels are each adjacent to the first pixel.

By means of still another embodiment of the method for measuring the holding properties of a TFT array of an active matrix comprising multiple pixel circuits with holding capacitors of the present invention, each of the multiple pixel circuits comprises a holding capacitor, a switching transistor for connecting a data line to the holding capacitor, and a gate line for controlling the switching of the switching transistor; the multiple pixel circuits comprise a first pixel group of at least a first and a second pixel circuit and a third pixel circuit that is not included in the first pixel group; and this measuring method comprises a step for successive charging to the holding capacitor of each of the pixel circuits in the first pixel group, a step for performing an effect-eliminating procedure on the third pixel circuit, and a step for successive measuring of the charge of the holding capacitor of each of the pixel circuits in the first pixel group.

By using the present invention, it is possible to simply eradicate in a short time the effect of reading charge that accumulates in floating capacity during writing on the measurements of a TFT array of an active matrix display panel.

DETAILED DESCRIPTION OF THE PREFERRED EMBODIMENT

Preferred embodiments for executing the present invention will now be described using FIGS. 1 through 8.

Figure 1:
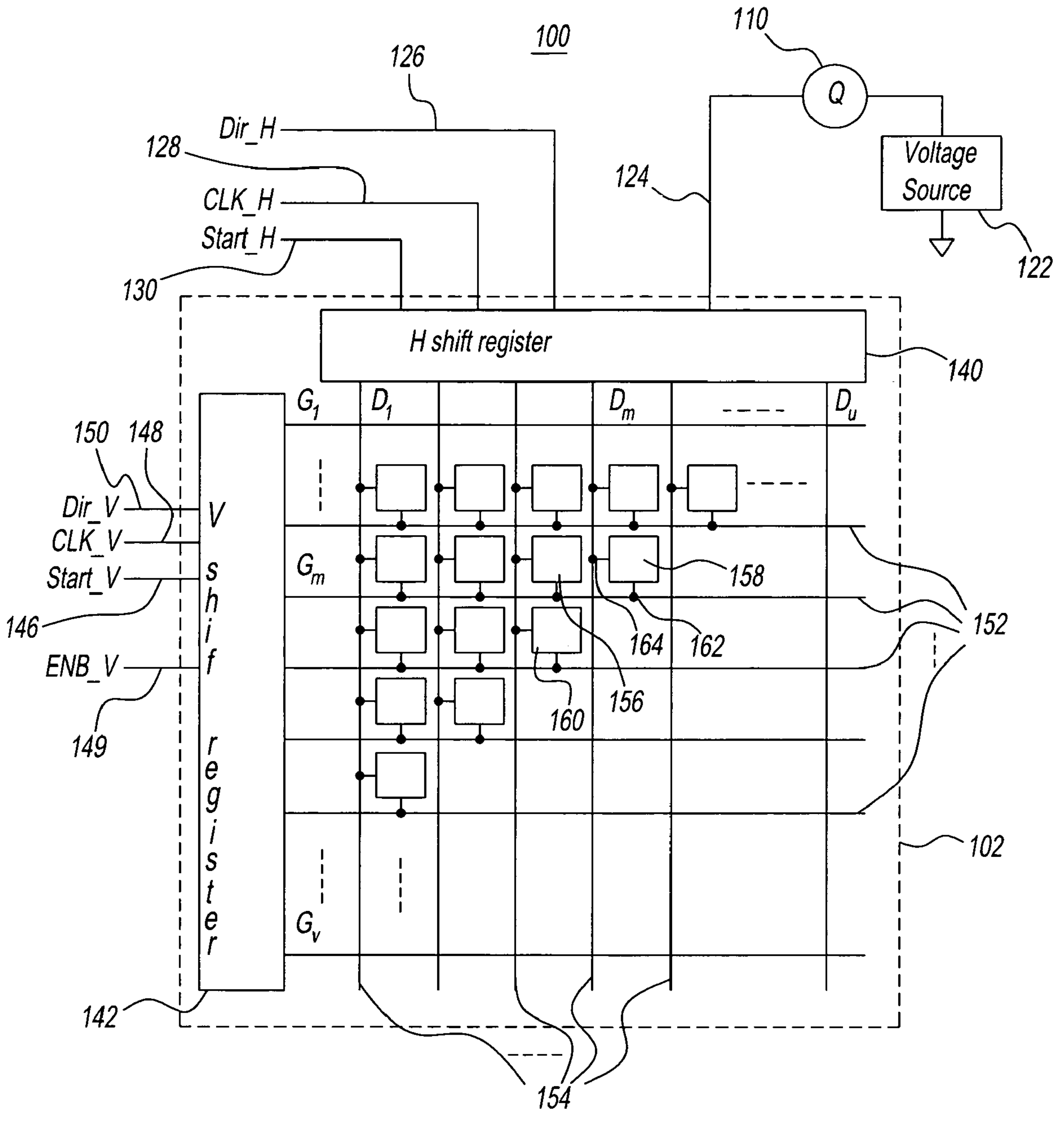
FIG. 1 is a block diagram of the testing circuit of the present invention.
Figure 2:
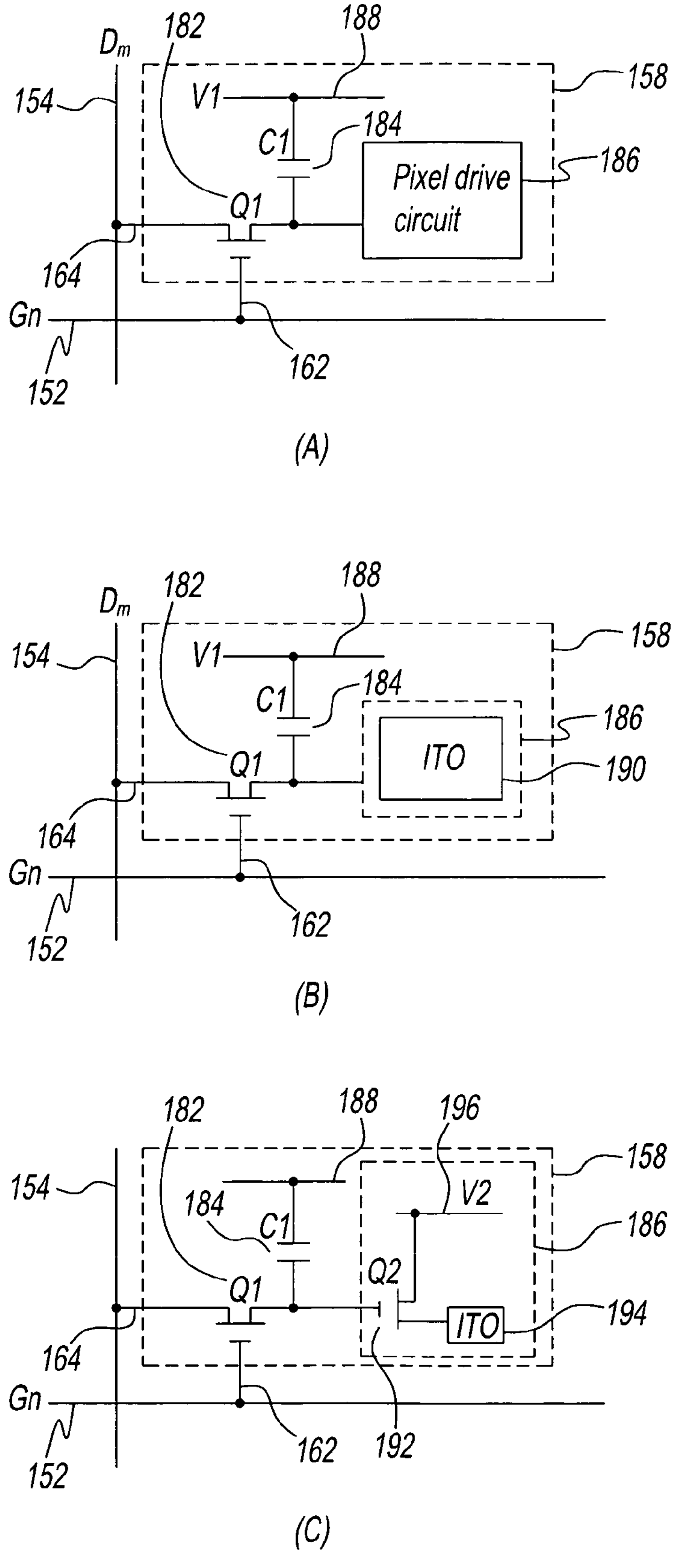
FIG. 2 is a block diagram describing the pixel circuit under test of the present invention.

FIG. 1 shows a block diagram of a measuring apparatus 100 of a TFT array of the present invention.

Each pixel circuit of the TFT array is referred to simply as a "pixel" in the following description.

A TFT array 102 comprises multiple pixels (referenced as 156, 158, 160, and so forth), and the voltage specified by the data line is written to a predetermined pixel by selecting a gate line 152 with a V shift register 142 and selecting a data line 154 with an H shift register 140. H shift register 140 and V shift register 142 each comprise a CLK_H (128), a CLK_V (148), a pulse input terminal Start_H (130), Start_V (146), shift direction terminals Dir_H (126) and Dir_V (150), and an enable terminal ENB_V (149), respectively.

H shift register 140 shifts the same number of logic high signals that have been given to pulse input terminal Start_H (130) as the number of clock signals that have been given to clock terminal CLK_H (128) in the direction specified by Dir_H terminal 126 and outputs signals that have been given to a data terminal 124 to a specific data line of data lines 154. Thus, the data lines that have not been selected are generally in an open state, or are shorted to another potential.

There are also H shift registers that have enable terminals, and in this case, signals that have been given to data terminal 124 are output to a specific data line only when the enable terminal is at logic high.

Next, V shift register 142 shifts the same number of logic high signals that have been given to pulse input terminal Start_V (146) as the number of clock signals that have been given to clock terminal CLK_V (148) in the direction prescribed by Dir_V terminal 150, and outputs ON voltage $V_{on}$ to a specific gate line of gate lines 152 only when logic high signals have been given to enable terminal ENB_V (149).

On the other hand, $V_{off}$ is output to a gate line connected to the shift register that was not selected.

It should be noted that another version of H shift register does not comprise an enable terminal ENB_V (149), and in this case, ON voltage $V_{on}$ is output to a specific gate line simply by selecting the shift register.

A variable voltage source 122 for applying voltage to the selected data line and a charge meter 110 for measuring the electric charge that has moved through the data line are connected in series to power source terminal 122 of H shift register 140.

As shown by pixel 158, for instance, each pixel of TFT array 102 is connected with a predetermined gate line ($G_n$ in the case of pixel 158) by a line 162 and similarly, a predetermined data line ($D_m$ in the case of pixel 158) by a line 164.

Unless otherwise specified, the phrase "written (writing)" in the pixel or holding capacitor of the present Specification means "charging" to the holding capacitor of that pixel, and the phrase "read" from the pixel or holding capacitor means "charge is discharged and this amount of charge is measured" from the holding capacitor of that pixel.

TFT array 102 used in the tests by the present invention is a liquid crystal or EL display panel. The present invention can be applied to test display panels before forming the liquid crystals or EL elements. The present invention can also be used for display panels after formation of liquid crystals or EL elements.

As shown in FIG. 2(A), each pixel, whether it is a liquid crystal or an EL display element, comprises a pixel selection transistor Q1 (182) wherein a gate and a source are connected to gate line $G_n$ (152) and data line $D_m$ (154), respectively; a holding capacitor C1 (184), which is connected to the drain terminal of the transistor and stores the output voltage of a transistor Q1 between the transistor and a common power source V1 (188); and a pixel drive circuit 186 connected to the same drain.

As shown in FIG. 2(B), the pixel drive circuit of a liquid crystal display panel comprises only an ITO electrode terminal for forming the liquid crystal.

As shown in FIG. 2(C), the pixel drive circuit 186 for an EL display panel comprises a transistor Q2 (192) for current driving, an ITO electrode terminal 194, and an EL driving power source V2 (196). An EL element can be formed on ITO electrode terminal 194 and connected to any signal line in advance. It should be noted that the measurement of the holding capacitor is made without relation to whether the EL element has been formed on ITO electrode terminal 194 or not.

Figure 3:
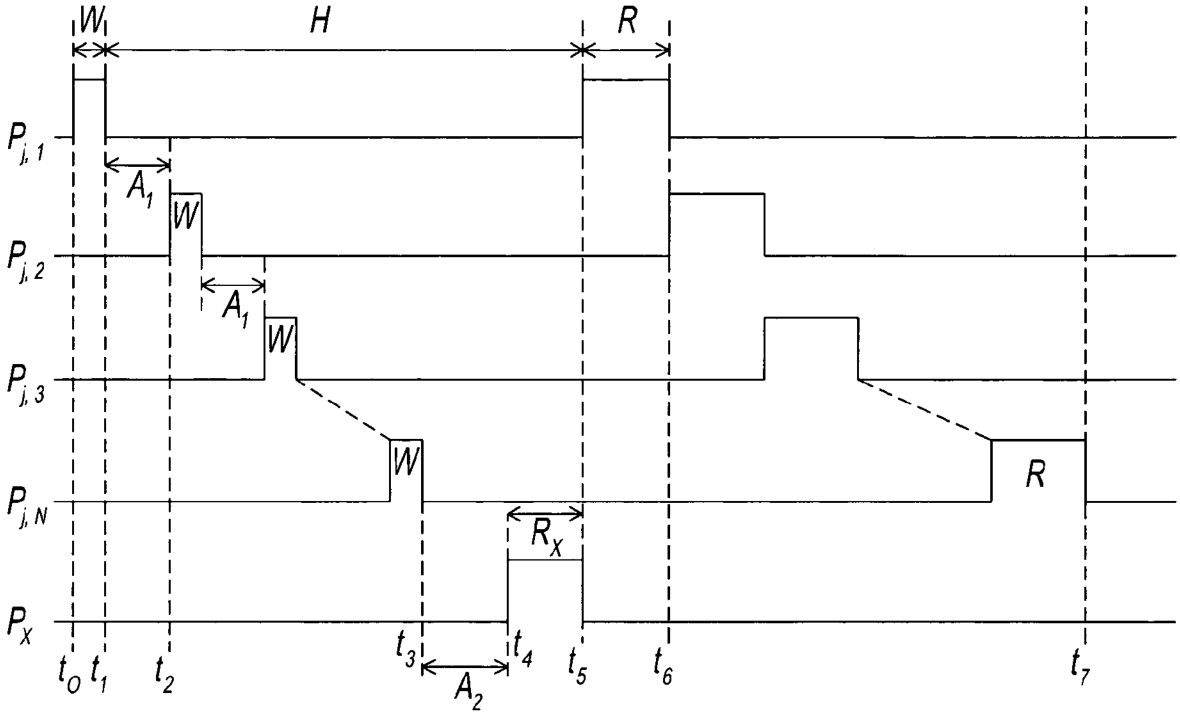
FIG. 3 is a timing chart describing the test by the present invention.

Next, the measurement algorithm of the present invention will be described using FIG. 3. By means of the present Specification, the $i^{th}$ pixel of the $j^{th}$ pixel group is called $P_{j,i}$, the gate line of this pixel is called $G_{j,i}$, and the data line is called $D_{j,i}$. The number S of pixels in the pixel group is S=N−1, and N is determined by N=H/R. The total number of pixel groups is T.

First, writing is started at time $t_o$ with emphasis placed on the holding capacitor of the first pixel $P_{j,1}$ of the $j^{th}$ pixel group in the present invention. Then the system waits for waiting time $A_1$ corresponding to the difference between the writing time and the reading time at time $t_1$ once writing time W has elapsed. Next, the reading of the second pixel $P_{j,2}$ of the second pixel of the $j^{th}$ pixel group starts at time $t_2$ and then the system waits for waiting time $A_1$. Thus, writing is performed for the S−1 number, that is, the N−2 number, of pixels and the system waits for waiting time $A_1$. Next, writing is performed for the S number, that is, the N−1 number, of pixels and the system waits for waiting time $A_2$ beginning at time $t_3$. Waiting time $A_2$ is determined by the correlated dummy writing time $R_x$ such that the holding capacitor of pixel $P_{j,1}$ retains the holding time H.

Next, dummy reading $R_x$ is performed starting from time $t_4$ as an effect-eliminating procedure for removing the entire effect or part of the effect that has accumulated in floating capacity at the end of the series of writing sequences. This dummy reading is performed on pixels other than the $j^{th}$ pixel group, preferably the immediately adjacent pixels (above pixel $P_{j,1}$ in this example) wherein the data line is the same as the first pixel of the $j^{th}$ pixel group. This effect-eliminating procedure can be accomplished by dummy reading by actually reading the pixel and measuring the charge that has been discharged from the holding capacitor of the pixel with a charge meter, or reading the voltage $V_r$ can be simply applied to the data line connected to the pixel and ON voltage can be set at the gate line connected to that pixel without measuring the charge with a charge meter. In the latter case, for instance, the movement of the charge that has flowed out to the data line can be brought to bypass the charge meter and an effect of the charge meter can be avoided by a conventional method, such as closing the reset circuit of the charge meter.

Next, the reading of the first pixel $P_{j,1}$ of the $j^{th}$ pixel group is started starting from time $t_5$ after dummy reading time $R_x$ has elapsed and thereafter reading is performed up to the pixels of the S group to become time $t_7$.

Thus, even if writing is performed on S number of pixels and charge has accumulated in floating capacity, a dummy reading procedure is performed as a procedure for eliminating the effect of the accumulated charge immediately before S pixels are read; therefore, the effect of any charge that has accumulated in the floating capacity of measurements can be reduced. The pixels that will be dummy read here are preferably connected to the same data line and is closest to the very first of the S number of pixels read. Consequently, it should be noted that when the pixels that will be dummy read are determined, this procedure is accomplished by the shortest movement, even if the V shift register is operated after dummy reading, and if a charge does newly accumulate in the floating capacity as a result of this procedure, it will be very small.

Furthermore, a V shift register is used to select the gate line between each pixel; therefore, Dir_V 150 operates such that movement in a predetermined direction continues when writing to S or reading S number of pixels. Once writing to S number of pixels has been completed, the optimal direction of movement to the position of the pixel that will be dummy read is specified by Dir_V 150 and the test device implements controls (not shown in FIG. 1) such that the shift operations for the necessary number of clock periods needed to move the desired pixel is performed. Consequently, a measurement timing design that takes the time margin of this shift operation is necessary. However, the shift register operating clock is sufficiently short when compared to the writing time and reading time. Therefore, the test program can easily adapt to movement to the pixel for dummy reading.

Figure 4:
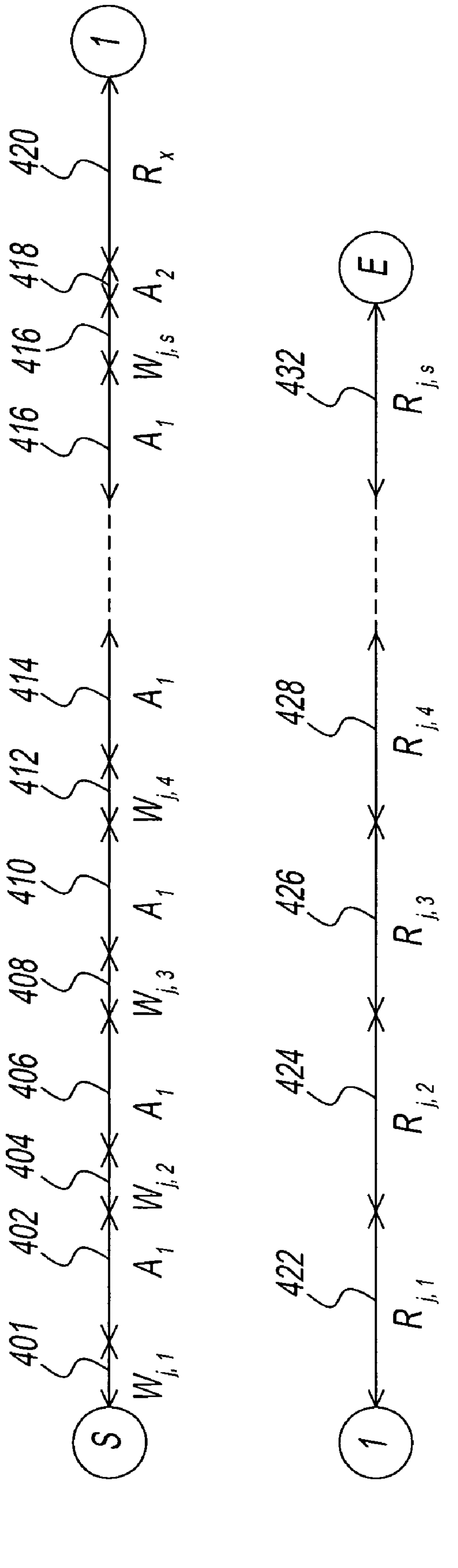
FIG. 4 is a drawing describing the test sequence in FIG. 3.

The algorithm introduced with FIG. 3 will now be described in more specific terms using FIG. 4. FIG. 4 is a schematic representation of the writing time/reading time/waiting time from the start of the test (node S) to the end of the test (node E), and the length of the x-axis is proportional to the length of time. The segment between node S and node 1 indicates the period when writing is performed on the first pixel to the S pixel of the $j^{th}$ pixel group. Waiting time $A_1$ (402, 406, 410, 414, and 415) or waiting time $A_2$ (418) is set up after each writing time $W_{j,1}$ to $W_{j,S}$ (401, 404, 408, 412, and 416) and dummy reading time $R_x$ 420 is inserted after this to reach node 1.

Next, the segment between node 1 and node E is the period wherein the system precharges to the holding capacitor and each pixel that has gone through holding time H is read. That is, pixels from the first to the N−1 pixel of the $j^{th}$ pixel group that have already been written and gone through a holding time are read, or $R_{j-1,1}$ (422), $R_{j-1,2}$ (424), $R_{j-1,3}$ (426), $R_{j-1,4}$ (428), and $R_{j-1,S}$ (432) are performed, to reach node E. The steps in above-mentioned nodes S through E are repeated for each pixel group to complete the test. If the number of pixels in the last pixel group does not satisfy S number by correlation with the number of pixels on the display panel, the algorithm can be adjusted as needed.

Moreover, even if it is not the last pixel group, when the pixels in a pixel group are at the end of the TFT array, the number of pixels can be less than the S number because a common data line is used. In order to guarantee the holding time H in this case, the appropriate writing or reading cycle can be corrected as needed by being replaced with waiting time, etc.

Figure 5:
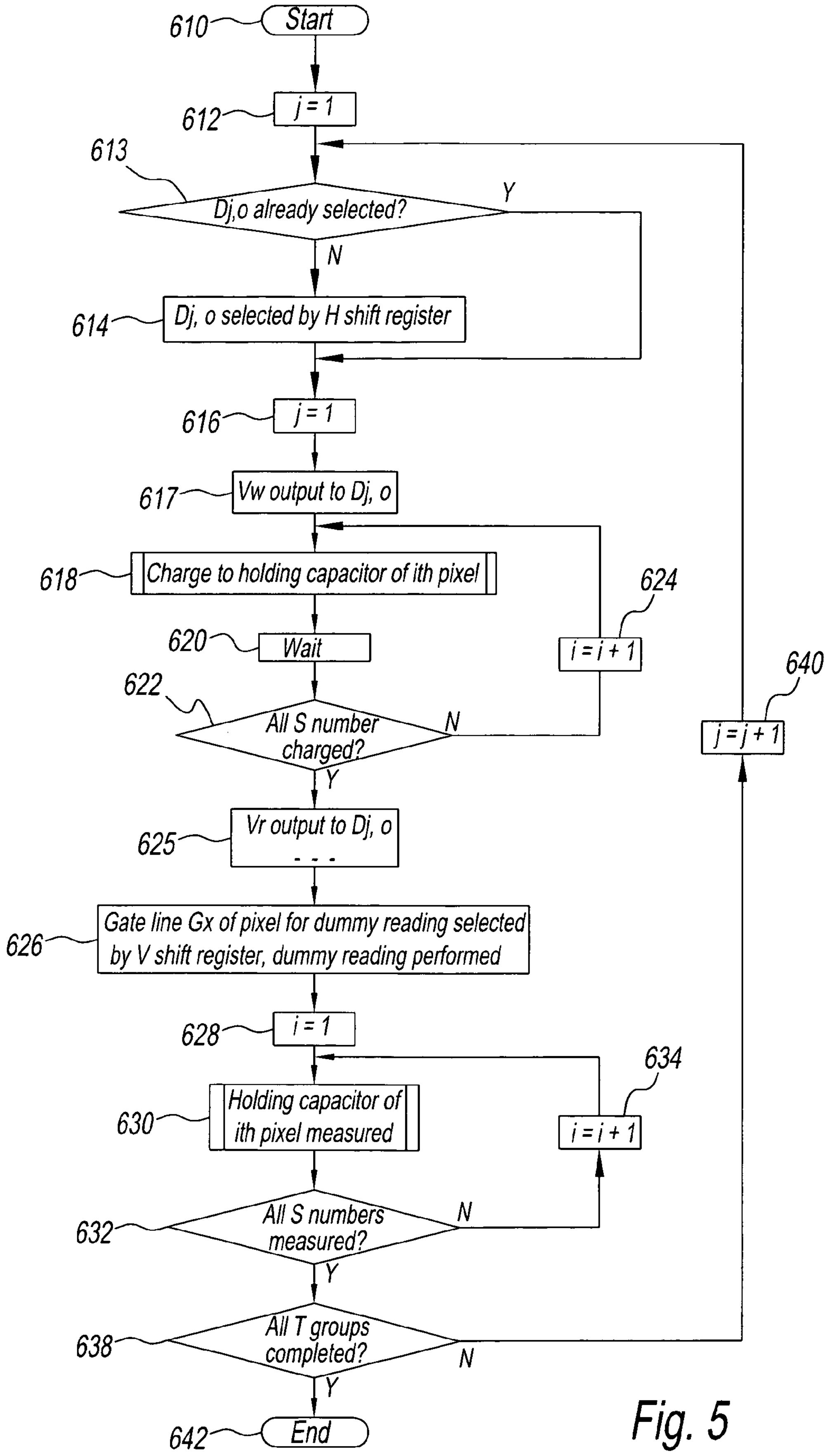
FIG. 5 is a flow chart explaining one example of the present invention.
Figure 6:
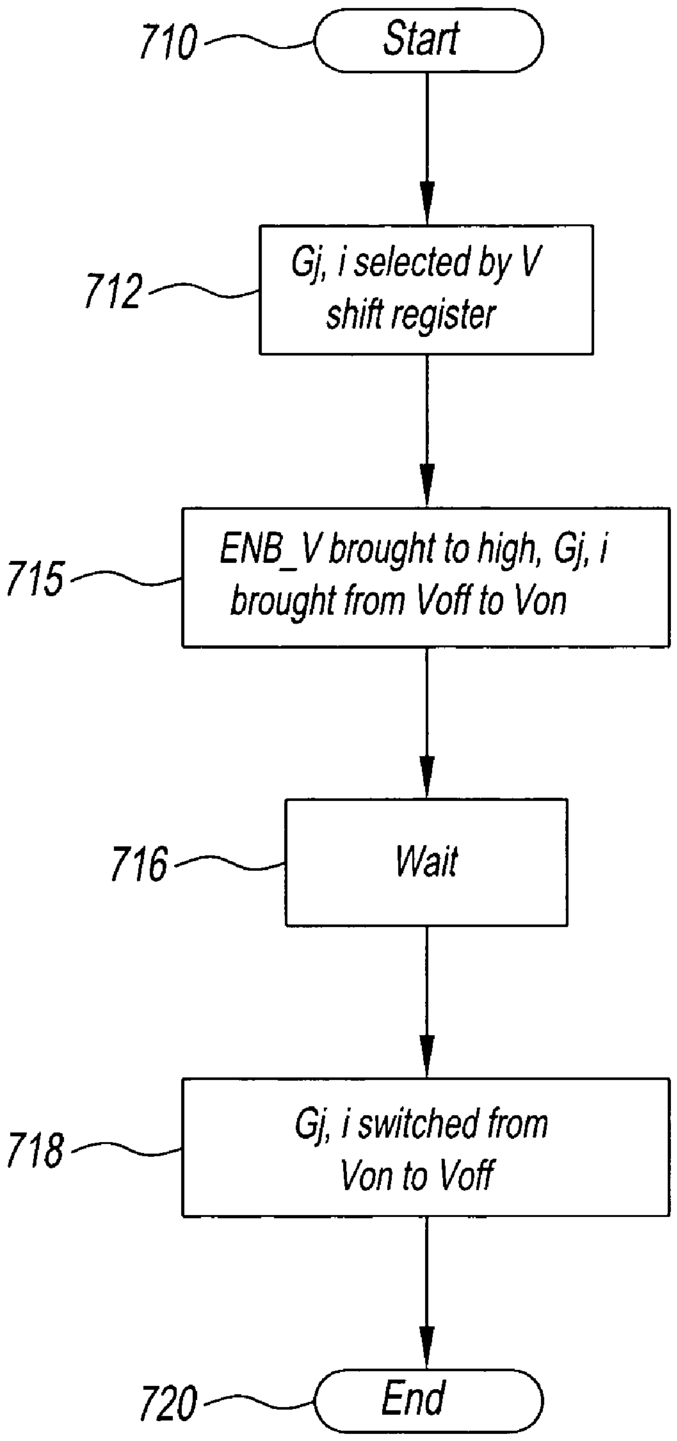
FIG. 6 is a flow chart describing in detail a part of the flow chart in FIG. 5.
Figure 7:
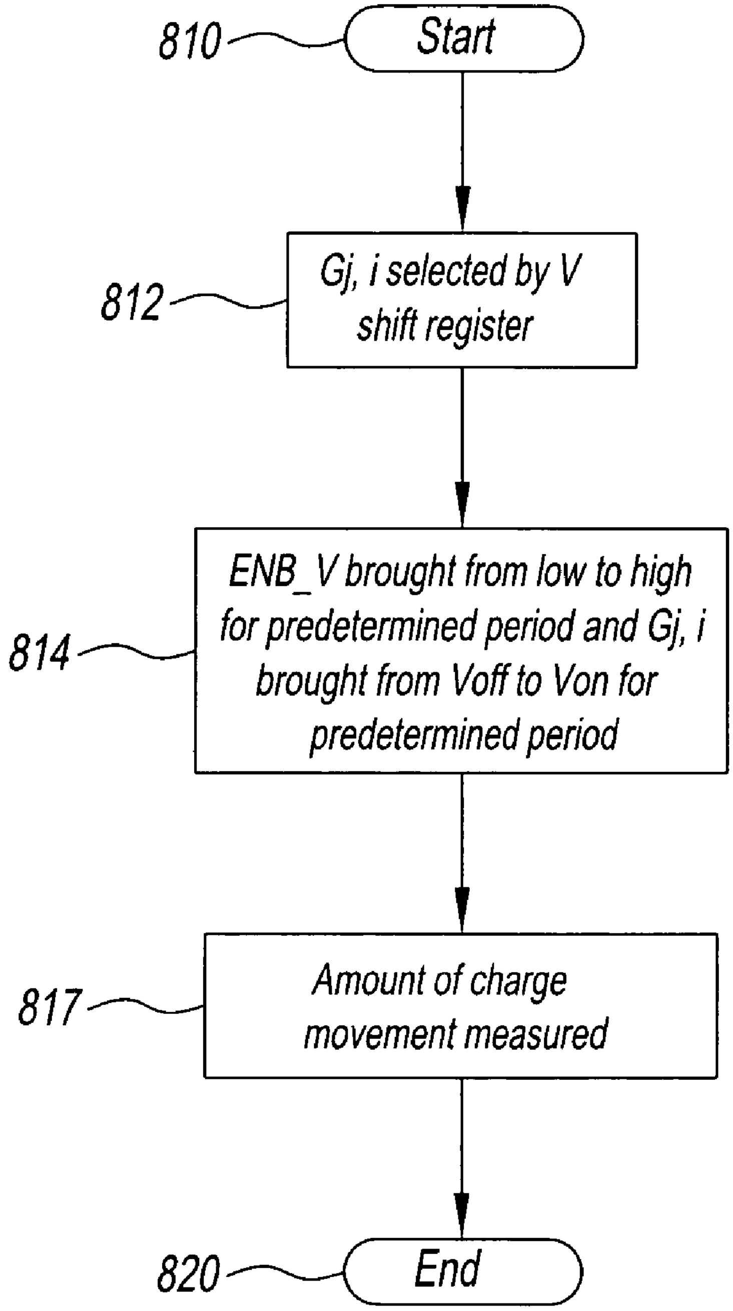
FIG. 7 is a flow chart describing in detail another part of the flow chart in FIG. 5.

Next, the algorithm shown in FIGS. 3 and 4 will be described in further detail using the flow charts in FIGS. 5 through 7. In FIG. 5, when the program starts at Step 610, a variable j showing the pixel group number is initialized at 1 at step 612. In order to shorten the selection time when a data line connected to this $j^{th}$ pixel group (hereafter only one data line is used for each pixel group and is, for instance, $D_{j,o}$) has already been selected by the H shift register, the system evaluates whether the data line previously selected is the same as $D_{j,o}$ at step 613, and if the answer is No, the system selects data line $D_{j,o}$ with H shift register 140 at step 614 and proceeds to step 616. Thus, charge meter 110 and variable voltage source 122 are connected to data line $D_{j,o}$ via H shift register 140. If the answer at step 613 is Yes, the system skips step 614 and proceeds to step 616.

Next, variable i showing the pixel number in the pixel group is initialized at 1 at step 616. Then at step 617, the output of variable voltage source 122 serves as writing voltage $V_w$ and writing voltage $V_w$ is output to data line $D_{j,o}$. The system charges, that is, writes, to the holding capacitor of the $i^{th}$ pixel $P_{j,i}$ at step 618, and waits for the necessary waiting time $A_1$ or $A_2$ at step 620. At step 622 the system evaluates whether or not S number of pixels have been charged and if the answer is No, variable i is increased by one at step 624, and the system returns to step 618. If the answer at step 622 is Yes, the output of variable voltage source 122 serves as the reading voltage $V_r$ and reading voltage $V_r$ is output to data line $D_{j,o}$. Next, gate line $G_x$ of pixels that have been assigned to dummy reading is selected by V shift register 142 in order to perform dummy reading and dummy reading is performed at step 626.

Variable i is initialized at 1 at step 628, the holding capacitor of the $i^{th}$ pixel $P_{j,i}$ is measured, that is, read, at step 630, the system evaluates whether or not all S number of pixels is read at step 632, and if the result is No, increases by one variable i at step 634 and returns to step 630. If the result is Yes, the system evaluates whether or not the test has been completed on all T pixel groups at step 638, and if the answer is No, the system increases by one variable j at step 640 and returns to step 613, while if the result is Yes, the system completes the program at step 642. Writing voltage $V_w$ is, for instance, 5 V, and reading voltage $V_r$ is, for instance, 0 V.

Next, step 618 of FIG. 5 will be described in detail while referring to FIG. 6. When this subroutine starts at step 710, gate $G_{j,i}$ connected to the desired pixel $P_{j,i}$ is selected by V shift register 142 at step 712. Next, enable terminal ENB_V is brought to logic high at step 715, and gate line $G_{j,i}$ is switched from $V_{off}$ to $V_{on}$. The system waits for a predetermined time as the charging time to holding capacitor at step 716. At step 718, enable terminal ENB_V is brought to logic low and the output of gate line $G_{j,i}$ is brought from ON voltage $V_{on}$ to OFF voltage $V_{off}$. Finally, the procedure of this routine is completed at step 720.

Step 630 of FIG. 5 will be described in detail while referring to FIG. 7. When this routine is started at step 810, gate line $G_{j,i}$ connected to pixel $P_{j,i}$ is selected by V shift register 142 at step 812.

Next, at step 814, enable terminal ENB_V is brought to logic high for a predetermined period and gate line $G_{j,i}$ is switched from the predetermined period OFF voltage $V_{off}$ to ON voltage $V_{on}$ and then returned to OFF voltage $V_{off}$. As a result, pixel selecting transistor $Q_1$ (182 in FIG. 2) of pixel $P_{j,i}$ is brought to an ON state for a predetermined period as the discharge time of the holding capacitor and a charge moves through transistor Q1 (182) between holding capacitor C1 (184 in FIG. 4) and the charge meter (110 in FIG. 1) in balance with the potential difference of data line $D_{j,o}$.

Next, the charge that has moved through data line $D_{j,o}$ is measured by charge meter 110 at step 817 and operation of this routine is completed at step 820.

The method for selecting the pixels to be read and written, that is, the method for identifying the pixel group (pixel sequence), and the method for selecting the pixels for dummy reading that are employed with the measurement algorithm of the present invention will be described with FIG. 8.

In order to facilitate the description, the position of each pixel is represented using X, Y coordinates with the top left corner of the display panel being 1. For instance, pixel (1,3) in FIG. 8 is represented as the pixel with the writing, that is, labeled, "1c." Furthermore, the number in the first position on the label is the pixel group number and the letter in the second position on the label is the order of the pixel in that pixel group. For instance, pixel (1,3) in FIG. 8 is labeled "1*c*," and this represents the third pixel of the first group. Each pixel of the first pixel group in FIG. 8 is assigned in order from pixel 1*a* (1,1) to pixel 1S (1,S). Moreover, the size of the display panel is represented by U×V, with the number of data lines being U and the number of gate lines being V.

Figure 8:
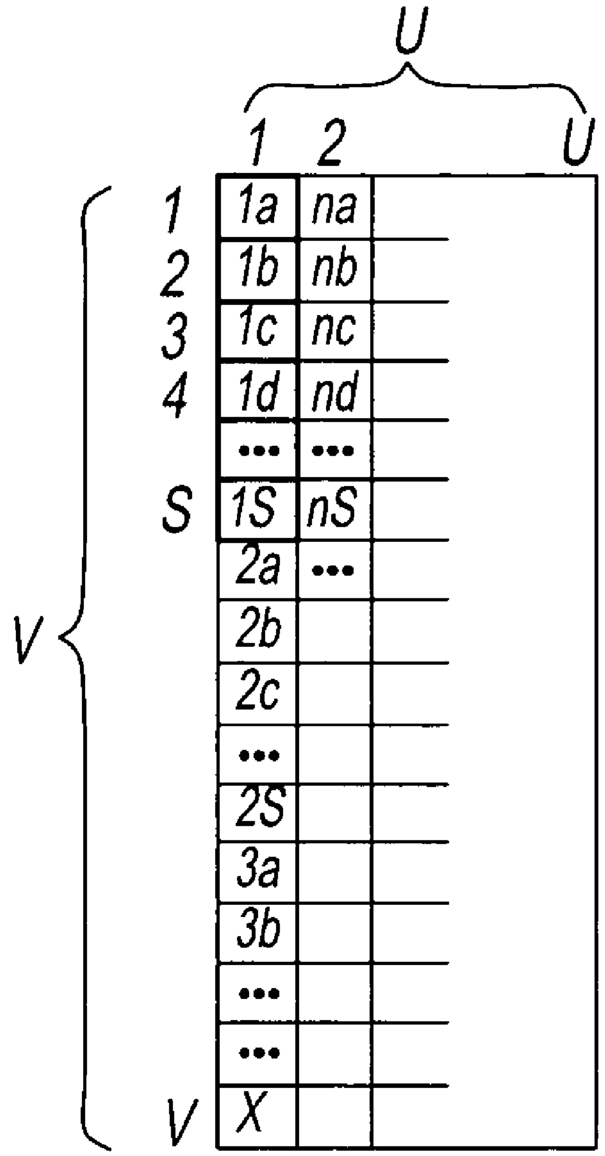
FIG. 8 is a schematic drawing showing a working example of the method of selecting pixel groups of one example of the present invention.

FIG. 8 is one example of a method for assigning pixel selection and operation by the present invention. Pixels groups are assigned for all of the pixels on the display panel by the procedure of starting with pixel (1,1) of the first pixel group, selecting S number of pixels from the top to the bottom, moving down to the next group of pixels, starting with pixel (1, S+1) and selecting S number of pixels from the top to the bottom, to reach the bottom end of the display panel, then starting with pixel (2,1) labeled with "na" in the row to the right of the first pixel group, shown as the n pixel group in the figure and selecting S number of pixels from the top to the bottom. Even if writing is repeated or reading is repeated within a predetermined pixel group, it is not necessary to select data lines, and adjacent gate lines can be selected. The algorithm is simple and takes less time to move through the pixels under test.

The procedure will now be described whereby a pixel for dummy reading is selected after writing to the last pixel 1S of the first pixel group. First, as previously described, the pixel for dummy reading should be one pixel above the first pixel of this pixel group, and in this case, it is the pixel at coordinates (1, V) labeled as pixel X, which is one pixel above pixel 1*a*. It should be noted that even if the pixels are separated at the top and bottom, as in this case, when moving from pixel X to pixel 1*a*, the system can move by one clock in a cycle from the bottom end to the top end of the display panel if the V shift register selects down as the shift direction, logic high is applied to the start terminal, and a one cycle clock is input.

When the selection of the V shift register has been changed from pixel 1S to pixel X prior to this, shifting up by S pixels is completed in a shorter clock cycle than shifting down in this case; therefore, the pixel X is selected by changing the setting of shift direction terminal Dir_V(150) from down to up, inputting logic high to the pulse input terminal Start_V (146), inputting S periods of clock signals to clock signal terminal CLK_V(148), and operating V shift register 142.

It goes without saying that the optimal direction and shift distance of movement from one pixel to the next should be determined based on the positional relationship between the pixels.

Once dummy reading is completed at pixel X, the setting of shift direction terminal Dir_V (150) is changed from up to down, logic high is input to pulse input terminal Start_V (146), one period of clock signal is applied, V shift register 142 is operated, and pixel 1*a* is selected and read.

Pixels are identified and registers are operated in the same way such that the pixel for dummy reading of the second pixel group is pixel 1S and the pixel for dummy reading of the third group is pixel 2S.

By means of the above-mentioned example, the position of the pixel for dummy reading was described as one pixel above the first pixel of each pixel group. The pixels in each pixel group are assigned from the top to the bottom in this case, and the distance of movement from a pixel for dummy reading to that pixel group should be as short as possible. The position of the pixel for dummy reading in other versions described below is the closest pixel in accordance with these restrictions.

Another method for assigning pixels is the method whereby a different pixel near the pixels included in a pixel loop serves as the position of the pixel for dummy reading, taking into consideration the position of the first and last pixels of a pixel group, the time it takes to move to the position of the pixel for dummy reading, and the trade-off with the effect of floating capacity on initial reading.

By means of another version of this assignment method, it is possible to select pixels in the row to the left of the row of previously assigned pixels as the first pixel of the next pixel group once assignment of one row on the display panel has been completed with a certain pixel group by the above-mentioned assignment method.

By means of yet another version of this method, the pixels of each group are selected not from the top to the bottom but rather from the bottom to the top, and the direction of the next row can be selected from the row to the right or the row to the left of the previous row.

Figure 9:
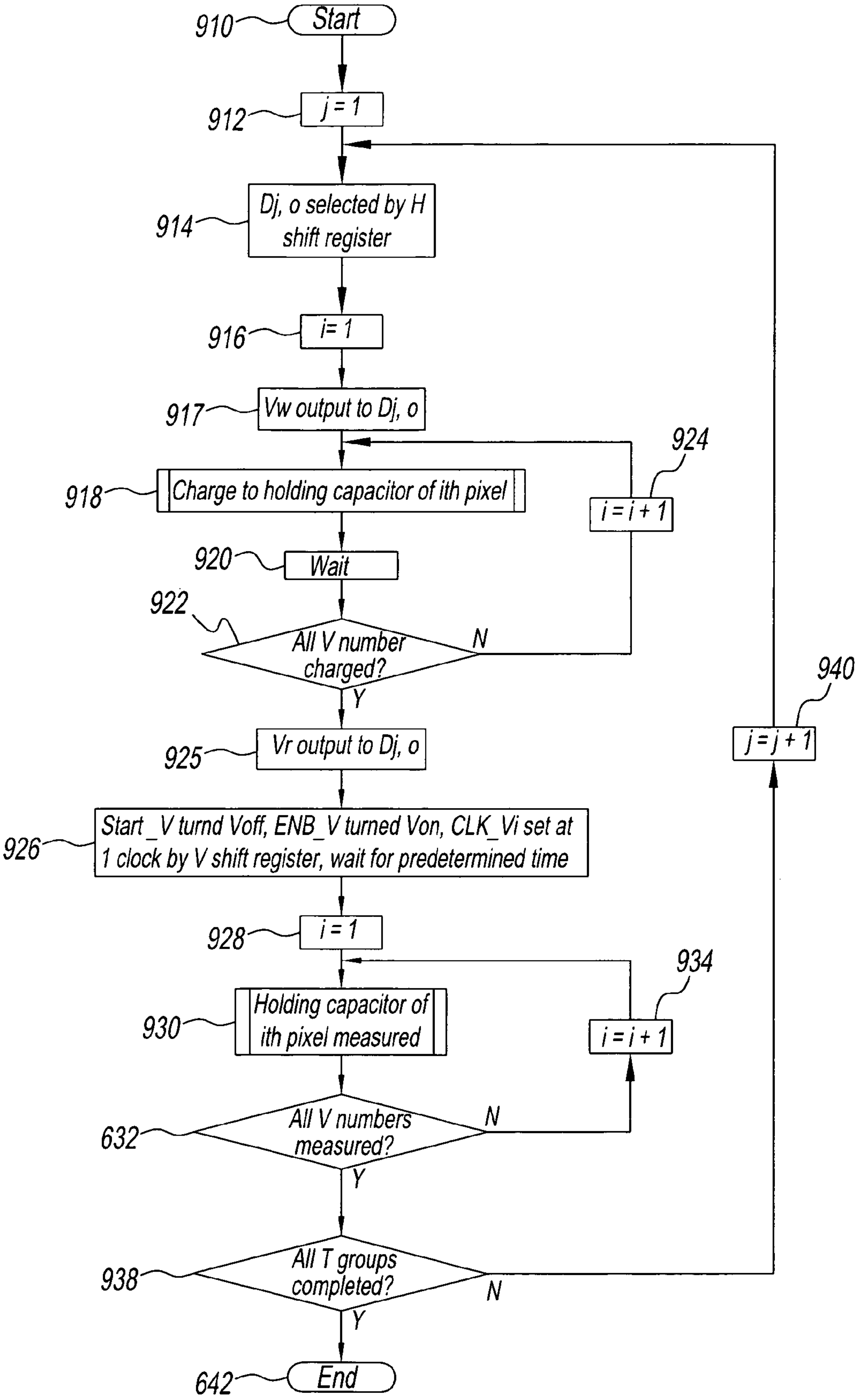
FIG. 9 is a flow chart explaining another example of the present invention.
Figure 10:
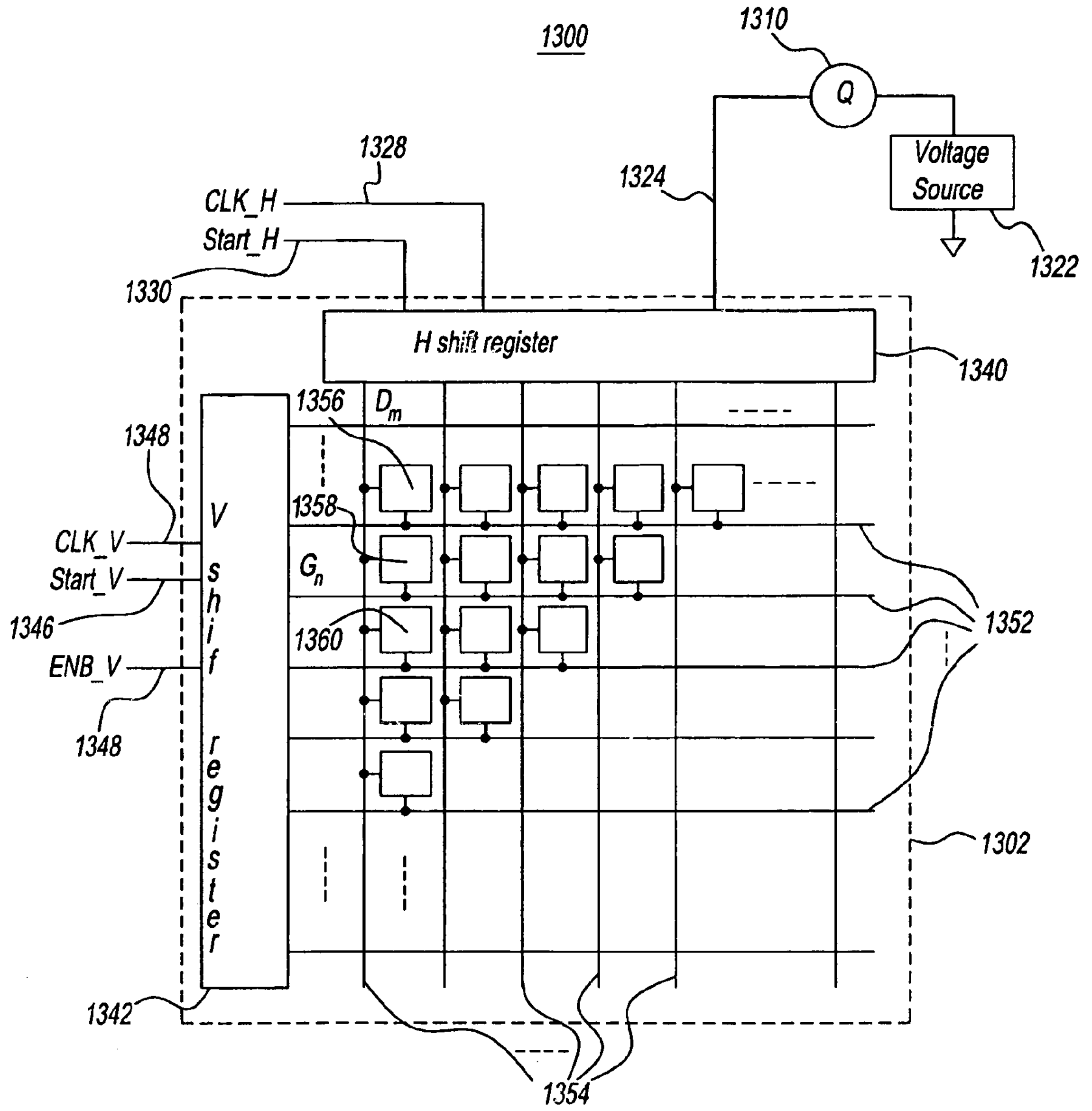
Fig. 10 Prior Art
FIG. 10 is a block diagram of the test device that operates by the test method of the prior art.
Figure 11:
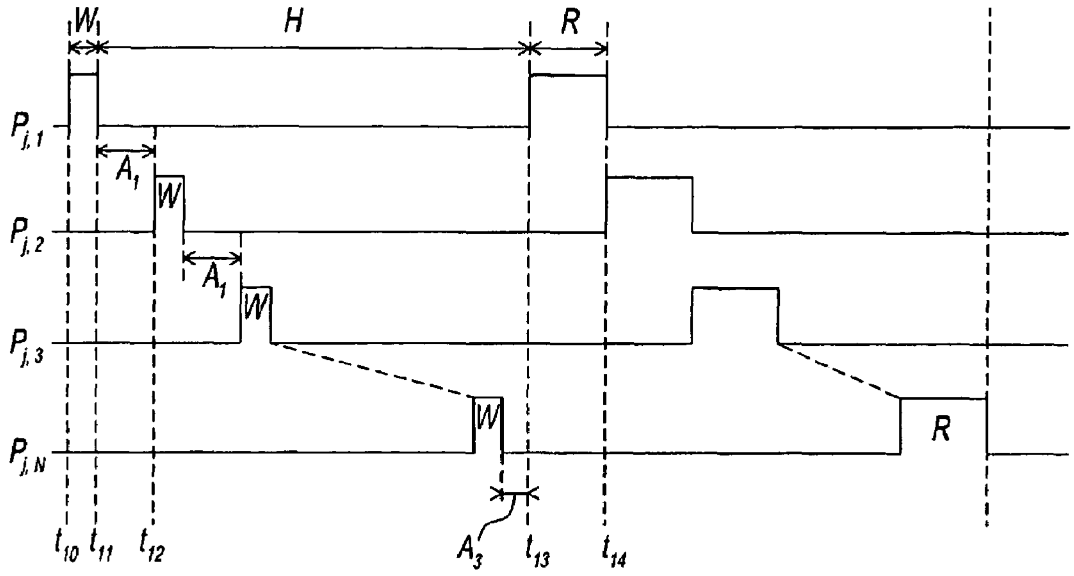
Fig. 11 Prior Art
FIG. 11 is a timing chart that describes the testing method based on the prior art.

A flow chart for different working examples with different dummy reading methods is shown in FIG. 9. When holding time H is sufficiently long in comparison to reading time R, or there are few pixels in the direction of length of the TFT array, S=N−1=V. In this case, it is possible to simplify dummy reading as in step 926 of the flow chart in FIG. 9.

That is, when the program is started at step 910, variable j showing the pixel group number is initialized at 1 in step 912. Data line $D_{j,o}$ is selected by H shift register 140 at step 914. The data lines of the pixel groups are different in the present working example; therefore, step 613 of FIG. 5 is omitted.

Variable i showing the pixel number in the pixel group is initialized at 1 in step 916. The output of variable voltage source 122 serves as writing voltage $V_w$ and writing voltage $V_w$ is output to data line $D_{j,o}$ in step 917. Next, as in FIG. 5, discharge to the holding capacitor of the $i^{th}$ pixel $P_{j,i}$, that is, writing, is performed at step 618, and the system waits for the necessary waiting time $A_1$ or $A_2$ at step 920. The system then evaluates whether or not S number of pixels, in this case, V number of pixels, have been charged at step 922, and if the answer is No, the system increases variable i by one at step 924 and returns to step 918. If the answer in step 922 is Yes, the output of variable voltage source 122 becomes reading voltage $V_r$ at step 925 and reading voltage $V_r$ is output to data line $D_{j,o}$. At step 926, V shift register 142 holds the signals to be given to shift direction terminal Dir_V (150), including the signals given thus far, gives logic OFF $V_{off}$ to pulse input terminal Start_V (146), gives logic ON $V_{on}$ to enable terminal ENB_V (149), gives one period of clock signal to clock terminal CLK_V 1348), and performs dummy reading by waiting for the necessary waiting time in order to eliminate the effect accumulated as floating capacity. That is, when described using FIG. 8, the selection of pixel (1, V) is completed when step 925 is reached. However, even though there is a shift input by one period of clock signal at step 926, logic ON is not given to pulse input terminal 146; therefore, the gate line of pixel (1,1) is not selected, and V shift register 142 has not selected a gate line; that is, an imaginary gate line has been selected. The effect-eliminating procedure can therefore be performed by operating V shift register 142 without having an effect on charge meter 110. The time it takes for shifting is very short in this case and the time it takes for dummy reading therefore is shortened.

Variable i is then initialized at 1 in step 928, the holding capacitor of the $i^{th}$ pixel $P_{j,i}$ is measured, that is, read, at step 630 as in FIG. 5, and the system evaluates whether or not all S pixels have been read at step 932. If the answer is No, variable i is increased by one at step 934 and the system returns to step 630. If the answer is Yes, the system evaluates whether reading has been completed for all T pixel groups at step 938. If the answer is No, the system increases variable j by one at step 940 and returns to step 914, and if the answer is Yes, the program is completed at step 942. Writing step 618 and reading step 630 can be described using FIGS. 6 and 7 and therefore are not described again here.

The holding properties of the holding capacitors of the active array matrix of the present invention were described with different examples and these were disclosed for the purpose of illustrating the present invention. It should be pointed out that the present invention is in no way limited to these examples. Various modifications easily understood by persons skilled in the art are possible. For instance, a system can also be considered wherein the amount of movement to the next pixel within a group is larger than 1, and the starting pixel of the first group can be set at a place other than at the edge of the display panel. The pixels in the test can be used to measure the properties of holding capacitors of an electroluminescence display panel other than that shown in FIG. 2(C).

Taking a sufficient time margin for pixel selection into consideration, the present invention can also be used for display panels with shift registers wherein the H shift register and/or the V shift register shifts in one direction only and not in both directions.

The present invention can also be applied to TFT arrays that do not have an H shift register and/or a V shift register on the TFT array by controlling the data and gate lines of the TFT array as needed using a testing device that is not shown in FIG. 1.

The present invention can also be used for process quality improvement whereby defects in the properties holding of capacitors are fed back to the previous step of the TFT array production process.

What is claimed is:

1. A method for measuring the holding properties of the TFT array of an active matrix display panel comprising multiple pixel circuits with holding capacitors, this measuring method being characterized in that each of the multiple pixel circuits comprises a holding capacitor, a switching transistor for connecting a data line to the holding capacitor, and a gate line for controlling the switching of the switching transistor; the multiple pixel circuits comprise at least a first pixel circuit, a second pixel circuit and a third pixel circuit; said method comprising: charging the holding capacitor of the first pixel circuit and then charging the holding capacitor of the second pixel circuit, performing an effect-eliminating procedure including a step of selecting the data line and the gate line of the third pixel circuit where the holding capacitor of the third pixel circuit is not charged in said charging step, and measuring the charges of the holding capacitor of the first pixel circuit and then measuring the charge of the holding capacitor of the second pixel circuit, respectively, wherein a predetermined holding time after charging has elapsed for each pixel circuit.

2. The measuring method according to claim 1, wherein the effect-eliminating procedure further comprises measuring the charge of the holding capacitor of the third pixel circuit.

3. The measuring method according to claim 1, wherein said first and second pixels are connected to the data line.

4. The measuring method according to claim 1, wherein said third pixel is also connected to the data line.

5. The measuring method according to claim 4, wherein said second and third pixels are adjacent to the first pixel.

* * * * *